United States Patent [19]

Hoepfner et al.

[11] Patent Number: 5,093,272
[45] Date of Patent: Mar. 3, 1992

[54] MANUFACTURING METHOD FOR A SELF-ALIGNED EMITTER-BASE-COMPLEX FOR HETEROBIPOLAR TRANSISTORS

[75] Inventors: Joachim Hoepfner, Planegg; Helmut Tews, Unterhaching; Hans-Peter Zwicknagl, Stuttgart, all of Fed. Rep. of Germany

[73] Assignee: Siemens Aktiengesellschaft, Munich, Fed. Rep. of Germany

[21] Appl. No.: 620,625

[22] Filed: Dec. 3, 1990

[30] Foreign Application Priority Data

Jan. 8, 1990 [EP] European Pat. Off. .......... 90100320

[51] Int. Cl.$^5$ .................... H01L 21/265; H01L 29/70
[52] U.S. Cl. ........................ 437/31; 357/34; 148/DIG. 10
[58] Field of Search .......................................... 437/31

[56] References Cited

U.S. PATENT DOCUMENTS 4,711,701 12/1987 McLevige ............................ 437/41
4,868,633 9/1989 Plumton et al. ...................... 357/67

FOREIGN PATENT DOCUMENTS

0240307A2 10/1987 European Pat. Off. .

OTHER PUBLICATIONS

"GaAs/(GaAl) As Heterojunciton Bipolar Transistors Using a Self-Aligned Substitutional Emitter Process" by M. F. Chang et al., 8179 IEEE Electron Device Letters, EDL-7, No. 1, Jan. 1986, New York, pp. 8-10.

*Primary Examiner*—Olik Chaudhuri
*Assistant Examiner*—Long Pham
*Attorney, Agent, or Firm*—Hill, Van Santen, Steadman & Simpson

[57] ABSTRACT

Method for manufacturing a self-aligned emitter-base complex whereby a sequence of epitaxial layers, which corresponds to the optimal base-emitter layer sequence in the re-etched part of the heterobipolar transistor is grown. Subsequently, the base implantation is introduced using a dummy-emitter as a mask. Using a dielectric mask covering the region not covered by the dummy-emitter, after the removal of the dummy-emitter the emitter contact layers are selectively grown in its region. The contacting is then provided.

12 Claims, 2 Drawing Sheets

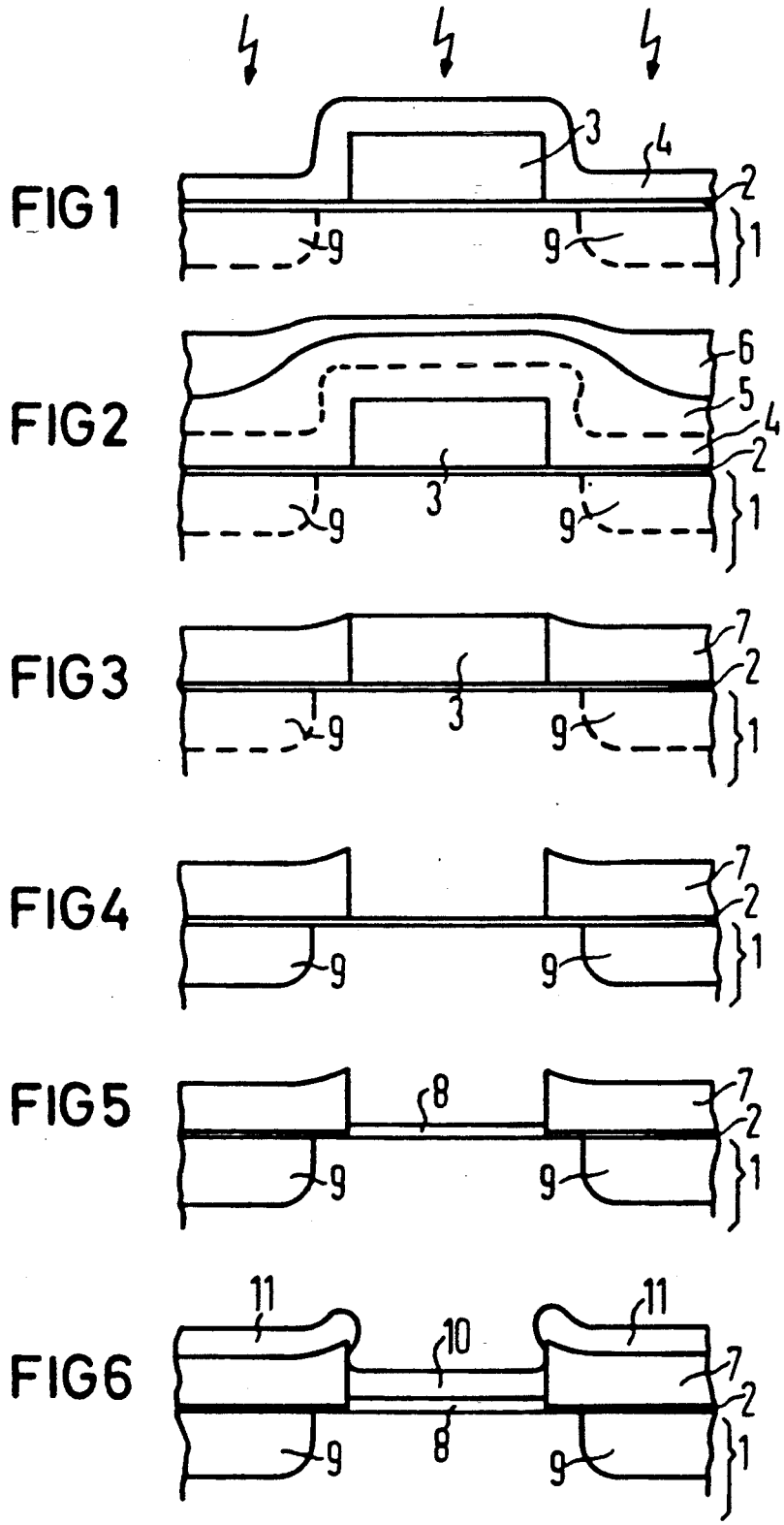

MANUFACTURING METHOD FOR A SELF-ALIGNED EMITTER-BASE-COMPLEX FOR HETEROBIPOLAR TRANSISTORS

BACKGROUND OF THE INVENTION

As when heterobipolar transistors (HBT) are manufactured in a GaAs/AlGaAs material system, the epitaxial layers for forming the collector, the base, the emitter, the collector terminal and the emitter terminal are deposited over the whole surface. Only afterwards are these layers structured and modified or removed by various processes (e.g. implantations, re-etching steps).

The operation of the heterobipolar transistor is considerably influenced by the fashioning of the self-aligned emitter-base complex in the region of the highly-doped emitter-contact layers. These contact layers usually consist of a $n^+$-GaAs-layer and a graded $n^+$-$In_yGa_{1-y}As$-layer.

If, during the manufacture of the heterobipolar transistor, the contact layers are not completely removed or insulated, an undesired parasitic emitter-base-sidewall diode results, which greatly reduces the power amplification in the HBT. The optimal conditions can only be established in a difficult manner in known manufacturing methods.

Usually, the emitter-contact layers are composed of a $n^+$-GaAs (doping level about $5 \times 10^{-}cm^{-3}$) having a thickness in the range of 0.1 to 0.2 $\mu m$ and a graded $n^+$-$In_yGa_{1-y}As$-layer (y greater than 0.5; doping level greater than $10^{19} cm^3$) having a thickness in the range of 0.03 to 0.1 $\mu m$ and grown on the $n_+$GaAs layer. In the self-aligned process, high-temperature stable tungsten silicide is used. Such a manufacturing process is described in the publication K. Ishii, T. Oshima, T. Fatatsugi, F. Fujii, N. Yokoyama, A. Shibatomi: "High-Temperature stable $W_5Si_3/In_{0.53}Ga_{0.47}As$ Ohmic contacts to GaAs for self-aligned HBTs" in IEDM 86, 274–277 (1986). Corresponding to FIG. 8 of this publication, a $W_5Si_3$-film is applied on $In_{0.53}Ga_{0.47}As$-layers which are grown on epitaxial layers that are usual for heterobipolar transistors. This tungsten silicide film and the emitter contact layers located therebelow are etched in the form of the emitter, and beryllium ions were implanted for the fashioning of the base regions. The tungsten silicide film serves as an implantation mask. After the annealing of the implants the base electrodes are manufactured by means of conventional photolithography.

In many known heterobipolar transistor process variations the tungsten silicide, for example, is structured via reactive ion etching ($CF_4$ or $SF_6$) and InGaAs- and $n^+$-GaAs-contact layers are etched with appropriate dry-etching methods. Also, wet-chemical etchings are used for the reetching of the contact layers. Such a method is described in the publication R. J. Malik, L. M. Lundardi, R. W. Ryan, S. C. Schunk, M. D. Feuer: "Submicron Scaling of AlGaAs/GaAs self-aligned thin emitter heterojunction bipolar transistors (SATE-HBT) with current gain independent of emitter area" in Electronics Letters 25, 1175–1177 (1989). With regards to this method, an epitaxial layer sequence composed of a n-doped GaAs-layer, a n-doped AlGaAs-layer, a n-doped GaAs-layer, a low n-doped GaAs-layer, a p-doped AlGaAs-layer, a n-doped AlGaAs-layer, a n-doped GaAs-layer, and a n-doped GaInAs-layer is grown on a semi-insulating substrate composed of GaAs. Thereupon, a tungsten layer is deposited over the whole surface. On this tungsten layer an emitter composed of a Ti/Au/Ni-layer sequence is generated by means of a lift-off technique and subsequently, the tungsten layer is re-etched to the dimensions of this emitter by means of reactive ion etching. In a following step, wet-chemical etching is used to re-etch the cover layer composed of GaInAs, after which the GaAs-layer located therebelow is selectively re-etched by means of reactive ion etching. The emitter layer composed of AlGaAs is then exposed and provided with AuBe-contacts by means of a lift-off technique. Lateral re-etching of the layer sequence through to the n-doped AlGaAs-layer exposes it for the contacting of the collector; wet-chemical etching and selective reactive ion etching being used. With regards to these methods, the elimination of the leakage currents between the emitter and base is a significant problem, i.e. optimal elimination of the emitter-base-sidewall diode.

SUMMARY OF THE INVENTION

It is an object of the present invention to provide a manufacturing method for a self-aligned emitter-base-complex which is not only easy to perform, but also avoids the problems which are connected with the re-etching of epitaxial layers.

This problem is solved with the method having the following steps: a sequence of epitaxial layers is grown for the area of the base, the base implantation provided for the area of the base is introduced by means of a dummy-emitter applied thereon, a dielectric mask is generated covering the region not covered by the dummy-emitter, after the removal of the dummy-emitter and the annealing of the base implantation, emitter contact layers and emitter-metallizations are applied using this dielectric mask and finally, after the removal of the dielectric mask, the base metallization is applied using a conventional mask technique.

Furthermore, on the epitaxial layers a sputter layer is applied over the whole surface, thereupon the dummy-emitter composed of photosensitive resist is grown and thereupon a first dielectric layer over the whole surface is grown. Then, the base implantation is introduced, a second dielectric layer is applied over the whole surface at least up to the height of the dummy-emitter and thereupon a levelling photoresist layer is grown. Subsequently, the first dielectric layer, the second dielectric layer and the photoresist layer are etched-off to the extent that the surface of the dummy-emitter is exposed. From the first and second dielectric layers a portion remains as the dielectric mask in the region not covered by the dummy-emitter. Subsequently, the dummy-emitter and the portion of the sputter layer therebelow are removed, the emitter contact layers are grown and a metal layer is applied over the whole surface. Subsequently, the dielectric mask with the portion of this metal layer located thereupon is removed, so that from this metal layer a portion remains on the emitter contact layers as emitter metallization.

The dummy-emitter can be manufactured with overhanging edges. Alternatively, the dummy-emitter can be manufactured with oblique edges and before the lift-off of the dielectric mask portions of the metal layer located thereon can be removed by means of a mask technique. Also, for the emitter contact layers, a first contact layer composed of binary semiconductor material is grown and thereupon a second contact layer composed of ternary semiconductor material with a grading in the portion of the third material component is grown.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 1–12 depict the steps of the manufacturing method of the present invention.

DESCRIPTION OF THE PREFERRED EMBODIMENT

Figure 7:
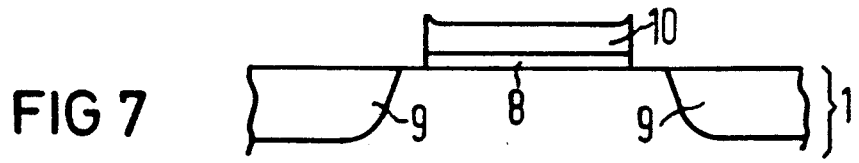
Figure 8:
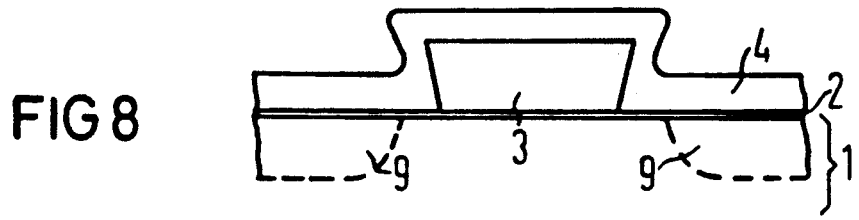
Figure 9:
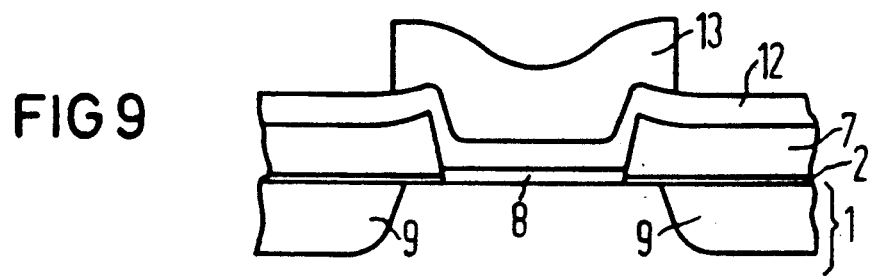
Figure 10:
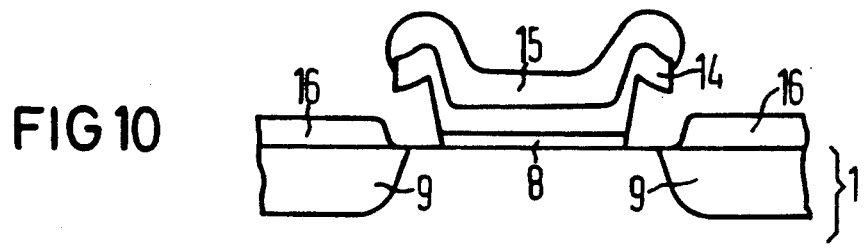
Figure 11:
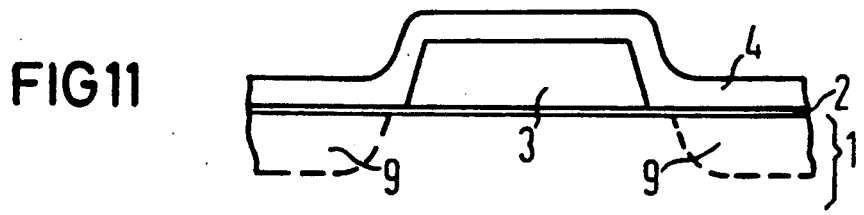
Figure 12:
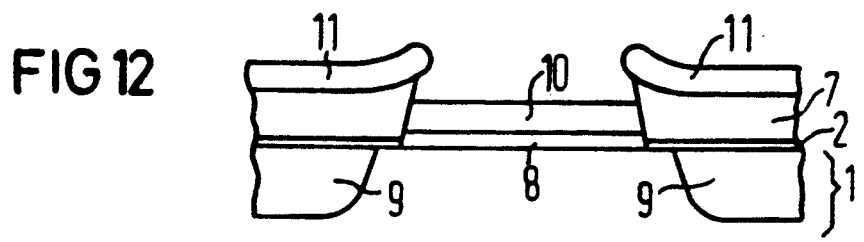

The FIGS. 1–7 depict, in cross-sectional views the structure of the emitter-base-complex after various steps of the manufacturing method for one embodiment of the present invention. The FIGS. 8–10 depict, in cross-sectional views the steps of the method corresponding to FIGS. 1, 6 and 7, in an alternative exemplary embodiment of the present invention. The FIGS. 11 and 12 depict in cross-sectional views a third exemplary embodiment corresponding to FIGS. 1 and 6.

In the method of the present invention, the layer sequence for the heterobipolar transistor is grown in a first epitaxy step only up to the layer which corresponds to the optimal emitter-base-layer sequence in the re-etched or insulation-implanted part of the heterobipolar transistor. The base area is prepared as an emitter region in self-aligned fashion and the emitter-contact-layers are selectively grown only afterwards in self-aligned fashion as the base region in a second epitaxy step and contacted.

In a first epitaxy step the layers standard for a heterobipolar transistor (subcollector layer, collector layer, base layer, emitter layer composed of e.g. AlGaAs and a thin low n-doped GaAs-layer in the GaAs-material system) are grown on a substrate. On these epitaxy layers 1, a thin sputter layer 2 (e.g. 100 nm SIN) is deposited. Thereupon, a dummy-emitter 3 is generated by means of photo-technique (see FIG. 1). As a spacer for a subsequent p+-implantation a 0.3 to 0.5 μm thick first dielectric layer 4 (e.g. SIN) is deposited over the entire surface (e.g. by means of CVD). Then, the p+-implantation for the later base contact terminal is performed, as indicated by the arrows in FIG. 1.

Subsequently, a second dielectric layer 5 (e.g. SiN) is deposited (e.g. by means of CVD), so that the total thickness of the dielectrium corresponds approximately to that of the dummy-emitter 3. A photosensitive resist layer 6 (e.g. AZ 111) for levelling the surface is then applied over the whole surface. The consequence of these applied layers and the base implantation 9 are shown in FIG. 2.

The photosensitive resist layer 6, the first and the second dielectric layer 4, 5 are then re-etched until the original photoresist structure, namely the dummy-emitter 3 is again exposed. As a result, in the region of the sputter-layer 2 not covered by the dummy-emitter 3 a portion remains from the first and possibly the second dielectric layer 4, 5 as a dielectric mask 7. The dummy-emitter 3 in between is removed via a solvent or in a dry-etching step (e.g O₂-plasma) (see FIGS. 3 and 4).

Thereupon follows the annealing of the p+-implantation. Subsequently, the thin sputter layer 2 is removed in wet-chemical or dry chemical fashion in the area of the emitter i.e. in the area not covered by the dielectric mask 7. On the now exposed surface of the epitaxy layers 1 (the surface of the low n-doped GaAs-layer) the emitter contact layers 8 are applied. These emitter contact layers 8 can be e.g. in the GaAs-material system a 0.1 to 0.2 μm thick high n-doped GaAs-contact layer and a $In_yGa_{1-y}As$-contact layer of a thickness of 0.03 to 0.1 μm graded in the portion of the indium. No epitaxy layer grows on the dielectric mask 7 (see FIG. 5).

Next, a metal layer for the emitter-metallization is deposited over the whole surface which can be e.g. $WSi_x$, if further high-temperature steps are provided in the process, or a different contact for n-semiconductor material as e.g. Ge/Au/Cr/Au or Ge/Au/Ni/Au. FIG. 6 shows this metal layer 11 with a portion as emitter metallization 10. The dielectric mask 7 together with that part of the metal layer 11 located thereon is removed with a lift-off technique. What remains is the structure according to FIG. 7, whereby the emitter layers 8 and the emitter metallization 10 are fashioned in self-aligned fashion as base implantation 9. The distances between the emitter contact layers 8 and the base implantation 9 can be adjusted within certain limits via the thickness of the first dielectric layer 4 in the step shown in FIG. 1.

FIG. 8 shows an embodiment whereby the dummy-emitter 3 is fashioned with overhanging edges. As a result the dielectric mask 7 corresponding to FIG. 9 has oblique sides, so that the emitter metallization is evaporated as coherent metal layer 12. This metal layer 12 is structured only in a further step by means of a photo-technique. This can occur e.g. as in FIG. 9 with a photoresist mask 13 which covers the region of the emitter metallization. That portion of the metal layer 12 not covered by this photoresist mask 13 is etched away. Then, the dielectric mask 7 can be removed and the emitter metallization 14 can be used as a mask when a further metal layer 15 is evaporated on for the base metallization 16. In this approach, a base metallization 16 results that is self-aligned relative to the emitter metallization 14. At the same time, the implanted base area (base implantation 9) is self-aligned to the emitter.

Another embodiment is shown by the FIGS. 11 and 12, whereby the dummy-emitter 3 is fashioned with oblique edges, which offers greater security during the lift-off step and further reduces the distance between emitter and base terminal area compared to the prior embodiments. The structure depicted in FIG. 11 corresponds to FIG. 1 and FIG. 12 corresponds to FIG. 6. Furthermore, it is possible to manufacture the dummy-emitter from metal (e.g. aluminum) instead of photosensitive resist. Then, in the step corresponding to FIG. 4, the dummy-emitter is not removed by a solvent, but is removed by a wet-chemical etching step (e.g. muriatic acid).

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. Method for the manufacturing of a self-aligned emitter-base-complex for heterobipolar transistors, comprising the steps of: growing a sequence of epitaxial layers for an area of a base; introducing base implantation provided for the area of the base by means of a dummy-emitter applied thereon; generating a dielectric mask covering a region not covered by the dummy-emitter; after removal of the dummy-emitter and curing of the base implantation, applying emitter contact layers and emitter-metallizations using the dielectric mask; after removal of the dielectric mask, applying the base metallization using a conventional mask technique; on the epitaxial layers a sputter layer being applied over the whole surface, thereupon being grown the dummy-emitter composed of photosensitive resist and thereupon being grown a first dielectric layer over the whole surface, after which, the base implantation is introduced, and then a second dielectric layer being applied over the whole surface at least up to the height of the dummy-emitter and thereupon being applied a levelling photoresist layer, subsequently, the first dielectric layer, the second dielectric layer and the photoresist layer being etched-off to the extent that the surface of the dummy-emitter is exposed and from the first and second dielectric layers a portion remains as a dielectric mask in the region not covered by the dummy-emitter, subsequently, the dummy-emitter and the portion of the sputter layer therebelow being removed, the emitter contact layers being then grown thereon and a metal layer being applied over the whole surface and subsequently the dielectric mask with the portion of this metal layer located thereupon being removed, so that from this metal layer a portion remains on the emitter contact layers as emitter metallization.

2. Method for the manufacturing of a self-aligned emitter-base-complex for heterobipolar transistors, comprising the steps of: growing a sequence of epitaxial layers for an area of a base; applying a sputter layer over the whole surface of the epitaxial layers, generating a dummy-emitter using a photosensitive resist; depositing a first dielectric layer over the whole surface, after which, a base implantation is introduced, applying, a second dielectric layer over the whole surface at least up to the height of the dummy-emitter; applying a levelling photoresist layer over the whole surface; etching the first dielectric layer, the second dielectric layer and the photoresist layer to the extent that the surface of the dummy-emitter is exposed and leaving a portion of at least the first dielectric layer as a dielectric mask in a region not covered by the dummy-emitter; removing the dummy-emitter and the portion of the sputter layer therebelow; applying emitter contact layers on an exposed surface of the epitaxial layers; applying a metal layer over the whole surface; and removing the dielectric mask with the portion of the metal layer located thereupon, so that from the metal layer a portion remains on the emitter contact layers as emitter metallization.

3. Method according to claim 2, wherein the dummy-emitter is manufactured with overhanging edges.

4. Method according to claim 2, wherein the dummy-emitter is manufactured with oblique edges and before the lift-off of the dielectric mask portions of the metal layer located thereon are removed by means of a mask technique.

5. Method according to claim 2, wherein a first contact layer composed of binary semiconductor material is grown and thereupon a second contact layer is grown composed of ternary semiconductor material with a grading in the portion of the third material component as the emitter contact layers.

6. Method for the manufacturing of a self-aligned emitter-base-complex for heterobipolar transistors, comprising the steps of: growing a sequence of epitaxial layers for an area of a base; introducing base implantation provided for the area of the base by means of a dummy-emitter applied thereon; generating a dielectric mask covering a region not covered by the dummy-emitter; after removal of the dummy-emitter and annealing of the base implantation, applying emitter contact layers and emitter-metallizations using the dielectric mask; and after removal of the dielectric mask, applying the base metallization using a conventional mask technique; applying a sputter layer over the whole surface of the epitaxial layers, generating a dummy-emitter using a photosensitive resist; depositing a first dielectric layer over the whole surface, after which, a base implantation is introduced, applying a second dielectric layer over the whole surface at least up to the height of the dummy-emitter and applying a levelling photoresist layer, over the whole surface etching the first dielectric layer, the second dielectric layer and the photoresist layer to the extent that the surface of the dummy-emitter is exposed and leaving a portion of at least the first dielectric layer as a dielectric mask in a region not covered by the dummy-emitter; removing the dummy-emitter and the portion of the sputter layer therebelow; applying a first contact layer composed of binary semiconductor material on the exposed surface of the epitaxial layers and applying thereupon a second contact layer composed of ternary semiconductor material with a grading in the portion of the third material component; applying a metal layer over the whole surface; and removing the dielectric mask with the portion of the metal layer located thereupon, so that from the metal layer a portion remains on the emitter contact layers as emitter metallization.

7. Method according to claim 6, wherein the dummy-emitter is manufactured with overhanging edges.

8. Method according to claim 6, wherein the dummy-emitter is manufactured with oblique edges and before the removing of the dielectric mask portions of the metal layer located thereon are removed by means of a mask technique.

9. Method for the manufacturing of a self-aligned emitter-base-complex for heterobipolar transistors, comprising the steps of: growing a sequence of epitaxial layers for an area of a base; generating a dummy-emitter; depositing a first dielectric layer over the whole surface, after which, a base implantation is introduced, applying, a second dielectric layer over the whole surface at least up to the height of the dummy-emitter; etching the first dielectric lay and the second dielectric layer to the extent that the surface of the dummy-emitter is exposed and leaving a portion of at least the first dielectric layer as a dielectric mask in a region not covered by the dummy-emitter; removing the dummy-emitter; applying emitter contact layers on an exposed surface of the epitaxial layers; applying a metal layer over the whole surface; and removing the dielectric mask with the portion of the metal layer located thereupon, so that from the metal layer a portion remains on the emitter contact layers as emitter metallization.

10. Method according to claim 9, wherein the dummy-emitter is manufactured with overhanging edges.

11. Method according to claim 9, wherein the dummy-emitter is manufactured with oblique edges and before the lift-off of the dielectric mask portions of the metal layer located thereon are removed by means of a mask technique.

12. Method according to claim 9, wherein a first contact layer composed of binary semiconductor material is grown and thereupon a second contact layer is grown composed of ternary semiconductor material with a grading in the portion of the third material component as the emitter contact layers.

* * * * *